United States Patent [19]
Hibino

[11] Patent Number: 6,022,142
[45] Date of Patent: Feb. 8, 2000

[54] MONITOR OF PROCESS TEMPERATURE AND FORMATION OF ALLOY

[75] Inventor: Satoshi Hibino, Hamamatsu, Japan

[73] Assignee: Yamaha Corporation, Japan

[21] Appl. No.: 08/848,509

[22] Filed: Apr. 28, 1997

[30] Foreign Application Priority Data

Apr. 30, 1996 [JP] Japan ................................ 8-109967

[51] Int. Cl.[7] .............................. G01K 7/16; H01L 21/28
[52] U.S. Cl. ........................ 374/178; 374/183; 374/185; 438/643; 438/653
[58] Field of Search ...................... 374/1, 172, 178–183, 374/185; 257/383–385, 758, 761, 763–765; 438/642–656, 660, 663

[56] References Cited

U.S. PATENT DOCUMENTS

| | | | |
|---|---|---|---|
| 4,764,026 | 8/1988 | Powell et al. ........................... | 374/178 |
| 5,278,099 | 1/1994 | Maeda .................................... | 437/192 |
| 5,435,646 | 7/1995 | McArthur et al. ...................... | 374/185 |
| 5,637,924 | 6/1997 | Hibino .................................... | 257/751 |
| 5,705,429 | 1/1998 | Yamaha et al. ......................... | 437/194 |
| 5,801,425 | 9/1998 | Kuroi et al. ............................. | 257/383 |

*Primary Examiner*—Vit Miska
*Attorney, Agent, or Firm*—Ostrolenk, Faber, Gerb & Soffen, LLP

[57] ABSTRACT

A method of measuring a substrate temperature includes the steps of: forming a first lamination of different metals on a substrate; subjecting the substrate to a heat treatment; measuring a sheet resistance of the substrate after the heat treatment; and estimating a temperature of the substrate during the heat treatment from a correlation between sheet resistances and heat treatment temperatures, the correlation being prepared in advance by subjecting preparatory substrates each having a second lamination having the same structure as the first lamination to heat treatments at a plurality of predetermined heat treatment temperatures and by measuring the sheet resistance of each second lamination layer after the heat treatment. The substrate temperature during heat treatment can be estimated easily without intervening the actual manufacture process by a temperature measuring process.

11 Claims, 6 Drawing Sheets

MONITOR OF PROCESS TEMPERATURE AND FORMATION OF ALLOY

This application is based upon Japanese Patent Application No. 8-109967 filed on Apr. 30, 1996, the entire contents of which are incorporated herein by reference.

BACKGROUND OF THE INVENTION a) Field of the Invention

The present invention relates to a method of measuring a temperature, and more particularly to a method of indirectly measuring a substrate temperature under heat treatment.

b) Description of the Related Art

Various types of heat treatments are carried out during semiconductor manufacture processes. The substrate temperatures at heat treatments affect the performances of final products. Impurity ions doped in semiconductor are activated and diffused depending on the temperatures and time durations of heat treatments carried out after the ion implantation. Wiring layers such as an Al layer deposited on a semiconductor substrate reflow depending on the temperatures and time durations (and types) of heat treatments carried out during or after the wiring layer deposition.

Sputtering is generally used for forming a wiring layer such as an Al layer and an Al alloy layer (alloy of Al and, Si or Si—Cu). For planarization of the surface of a film deposited by sputtering, reflow is often used in which the deposited film is heated to fluidize it. A reflow temperature of Al or Al alloy is usually 400 to 500° C. High temperature sputtering is also used in which not only reflow is carried out after sputtering, deposition and reflow are both carried out during sputtering by heating the substrate.

In the following, a substrate heating process used for forming an Al or Al alloy film will be described by way of example without any limitative sense. For simplicity, Al and Al alloy are collectively called an Al alloy.

Some Al alloy wiring layers may have unsatisfactory surface flatness or low resistance. If the surface flatness is poor, the precision of succeeding photolithography may lower or the step coverage of a film formed thereafter may degrade. If a desired low resistance is not obtained, the circuit performance may degrade or it may cause breakage of a wiring.

In order to avoid such phenomena and maintain good product quality and manufacture yield, it is important to control process parameters. The substrate temperature at heat treatment is one of the important parameters.

FIGS. 5A and 5B illustrate a typical one of conventional methods of measuring a substrate temperature. A semiconductor substrate 51 is placed on a heater 55, and temperatures are measured at representative points on the semiconductor substrate 51 during heat treatment. The tips of thermocouples 52a–52d, 52f (collectively indicated at 52) are fixed to these representative points at which temperatures are measured.

In the example shown in FIGS. 5A and 5B, four thermocouples 52a–52d are fixed to the semiconductor substrate in the radial directions thereof and another thermocouple 52f is fixed at the center thereof. The lead wires of the thermocouples are bundled together and guided to the outside via a feed through 53 to be connected to thermocouple terminals of a pen recorder 57. The pen recorder 57 records the temperatures measured with the thermocouples 52 as a function of time.

This measuring method can measure the temperatures of the substrate at the points where the thermocouple is positioned, in real time during heat treatment. The measured signals (voltage signals) are automatically recorded by the recorder. The pen recorder usually has thermocouple terminals to which the thermocouples are connected, so that it can directly record the measured signals as temperatures.

With this method, it is necessary for temperature measurement to mount thermocouples on a semiconductor substrate. Furthermore, for a process to follow, the thermocouples once mounted are required to be dismounted.

The number of thermocouples to be mounted on a semiconductor substrate to measure the surface temperature is limited inevitably. The limited number of thermocouples means the limited number of temperature measuring points. It is therefore not so easy to measure a fine temperature distribution in the surface of a semiconductor substrate.

If the mount state of a thermocouple is bad, the reliability of measurement results is lost and measurement reproductivity becomes poor.

If a wiring layer is sputtered and heat treatment for a reflow process is consecutively performed, thermocouples cannot be mounted on the semiconductor substrate unless it is moved to the outside after the sputtering process. Although the reflow process is required to be executed consecutively after the sputtering, this reflow process should be interrupted by transferring the substrate to the outside and mounting thermocouples. Therefore, high fidelity reproduction of the processes becomes difficult because of this temperature measurement.

SUMMARY OF THE INVENTION

It is an object of the present invention to provide a substrate temperature measuring method capable of measuring temperatures in a simple manner without interrupting essential manufacture processes.

It is another object of the present invention to provide a substrate temperature measuring method capable of measuring temperatures at a number of unlimited, desired points.

It is another object of the present invention to provide a substrate temperature measuring method having good reproductivity and high precision.

It is still another object of the present invention to provide a semiconductor device manufacture method capable of controlling the formation of an alloy layer in a lamination structure during heating.

According to one aspect of the present invention, there is provided a method of measuring a substrate temperature comprising the steps of: forming a first lamination of different metals on a substrate; subjecting the substrate to a heat treatment; measuring a sheet resistance of the substrate after the heat treatment; and estimating, after the heat treatment, a temperature of the substrate during the heat treatment from a correlation between sheet resistances and heat treatment temperatures, the correlation being prepared in advance by subjecting preparatory substrates each having a second lamination having the same structure as the first lamination to heat treatments at a plurality of predetermined heat treatment temperatures and by measuring the sheet resistance of each second lamination after the heat treatment.

Since the correlation between sheet resistances and heat treatment temperatures is prepared in advance, the temperature applied during the heat treatment can be estimated by measuring the sheet resistance of the lamination layer after the heat treatment.

The temperature applied to the substrate during the heat treatment can be estimated after the heat treatment without changing a sequence of the heat treatment and the structure of the substrate.

The number of temperature measurement points is not limited and can be set as desired at any positions.

Application of this method is not limited only to estimation of a substrate temperature from the sheet resistance. For example, the formation of an alloy layer depending on a heat treatment temperature can be controlled by checking sheet resistance, because the alloy layer is formed depending upon a heat history of a wiring layer (a peak value of heat applied to the wiring layer during the heat treatment).

DETAILED DESCRIPTION OF THE PREFERRED EMBODIMENTS

The present inventor has studied the causes of variation of resistance of a wiring layer after heat treatment.

Figure 5A:
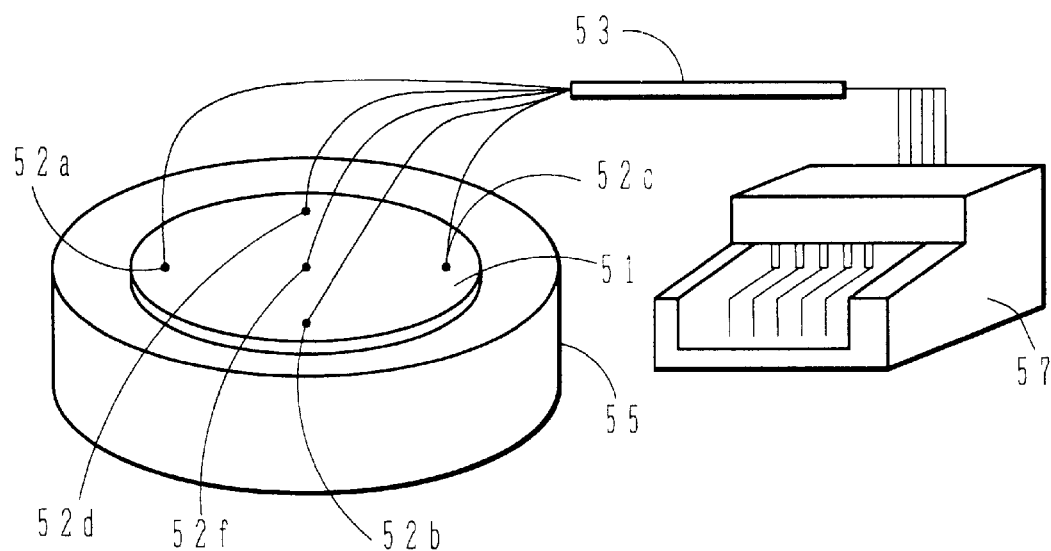
FIGS. 5A and 5B are a schematic, perspective view illustrating a conventional substrate temperature measuring method and a cross sectional view of a sample used for preliminary experiments.
Figure 5B:
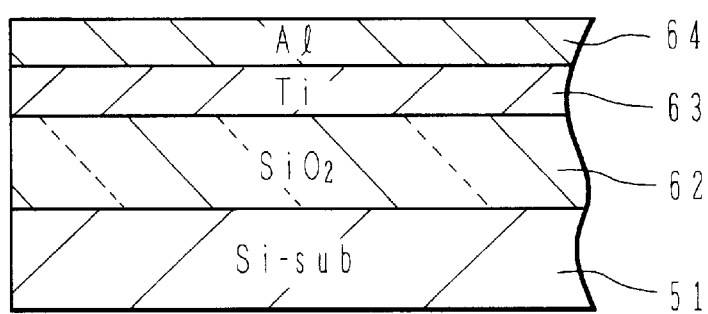

FIG. 5B shows the structure of a typical wiring layer. On the surface of a Si substrate 51, an $SiO_2$ layer 62 is formed as an insulating film. On the surface of the $SiO_2$ layer 62, a Ti layer 63 is formed as a close contact layer on which an Al layer 64 is formed as a main wiring layer. A contact hole is formed in the $SiO_2$ layer 62 at a desired position, and a lamination wiring layer of the Ti layer 63 and Al layer 64 is connected via this contact hole to the Si substrate 51.

The present inventor conducted various heat treatments of wiring layers such as shown in FIG. 5B, and checked changes in composition profiles of the wiring layers by Auger electron spectroscopy (AES). The Ti layer 63 used in experiments was about 40 nm thick and the Al layer 64 was about 20 nm.

Figure 6A:
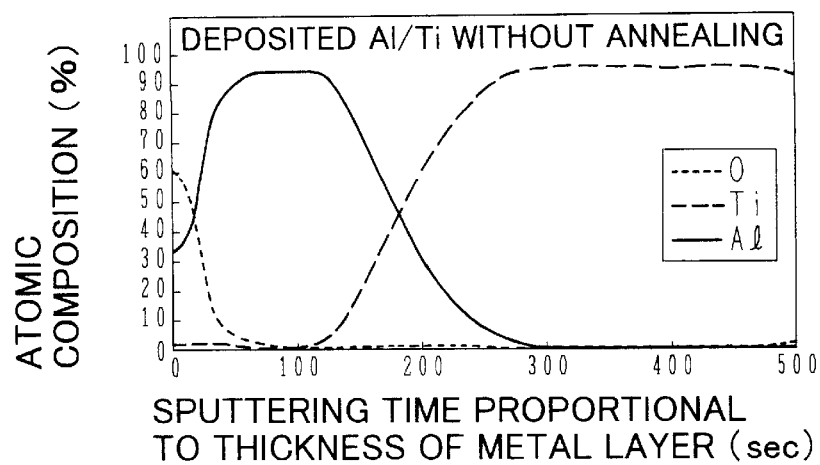
FIGS. 6A–6C are graphs showing a change in composition profiles of a wiring layer in the depth direction, the compositions being measured in preliminary experiments by Auger electron spectroscopy (AES).

FIG. 6A shows the measurement results of changes in composition profiles of the lamination structure of a wiring layer composed of the Ti layer as a close contact layer and the Al layer as a main wiring layer, the measurement being conducted in the depth direction from the surface of the wiring layer by AES, without any annealing. The abscissa represents a sputtering time in the unit of second when the wiring layer is etched from the surface thereof by sputtering, and the ordinate represents the composition of the wiring layer at each position in the depth direction.

The solid line indicates the composition of Al, and a broken line indicates the composition of Ti. A dot line indicates the composition of oxygen (O). It can be seen from this graph that the Al layer is formed in the surface layer of the wiring layer and the surface of the Al layer is oxidized.

Figure 6B:
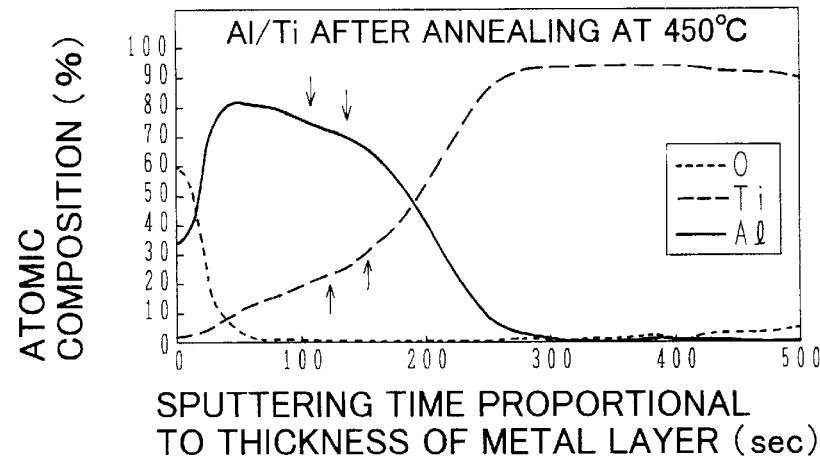

FIG. 6B shows the measurement results after a heat treatment (annealing) at 450° C. after the Al/Ti lamination structure is deposited. The abscissa and ordinate have the same meanings as FIG. 6A. It can be seen that the Ti component permeates into the Al layer and the Al component at the area in contact with the Ti layer reduces correspondingly.

Figure 6C:
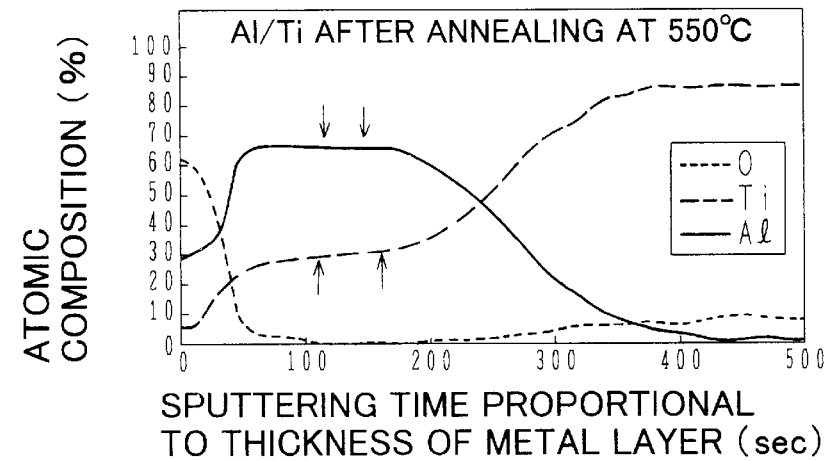

FIG. 6C shows the measurement results after an annealing at 550° C. after the Al/Ti lamination structure is deposited. The abscissa and ordinate have the same meanings as FIGS. 6A and 6B. It can be seen that in the Al layer area, the Al composition reduces throughout the whole depth to about 70 atom % concentration or smaller and that the Ti composition is about 20–30 atom % concentration throughout the whole depth of the Al layer. As compared with FIG. 6B, in the Al layer area, both the Al and Ti compositions are changed to take generally constant values in FIG. 6C.

From the analysis of these measurement results, it can be seen that the heat treatment of the Al/Ti lamination layer causes Ti diffusion into the Al layer and that the heat treatment at 450° C. causes a gradual Ti diffusion into the Al layer.

It is estimated that in the heat treatment at 550° C. some stoichiometry such as $TiAl_3$ has been established because both the Al and Ti compositions take some constant values. It can be presumed that once such stoichiometry is established, Ti does not diffuse further. It is estimated that such Ti diffusion to a constant concentration starts at a temperature of 450° C. or higher and almost completes at 550° C.

Figure 7:
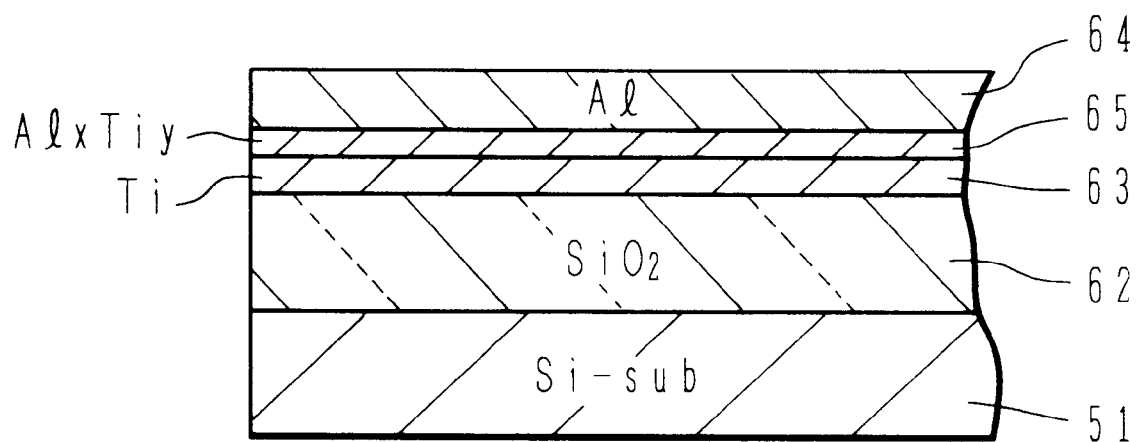
FIG. 7 is a cross sectional view showing the structure of a wiring layer after heat treatment.

FIG. 7 shows the structure of the wiring layer after heat treatment, the structure being conceivable when the above measurement results are taken into consideration. The Al/Ti lamination layer is formed on the $SiO_2$ layer 62 which is formed on the surface of the Si substrate 51. The Al/Ti lamination layer contains an alloy layer 65 of $Al_xTi_y$ at the interface between the Al and Ti layers after the heat treatment. This alloy layer 65 sometimes completely occupies the Al layer 64 or Ti layer 63.

Al is known as a metal having a low resistivity among various metals. As the alloy layer 65 of $Al_xTi_y$ is formed at the interface between the Al and Ti layers, the thickness of the Al layer is reduced correspondingly and the volume of the main wiring layer of a low resistivity reduces. Therefore, the resistance of the wiring layer increases. Moreover, in the contact area between the wiring layer and the underlying conductive layer such as a Si substrate, a contact resistance increases because of intervention of the intermediate layer having an increased resistivity.

The substrate annealing temperature, formation of an alloy layer, and a sheet resistance are closely or tightly related to each other.

It is therefore desired to manage the formation state of an Al—Ti alloy in order to maintain a low resistivity of a lamination wiring layer containing an Al or Al alloy layer. The formation of the Al—Ti alloy is dependent upon an annealing temperature so that managing the substrate temperature is an important issue.

The formation of an alloy layer itself can be estimated through measurement of a sheet resistance. If undesired results are obtained, the processes can be modified to proper processes by changing the substrate temperature.

Figure 1:
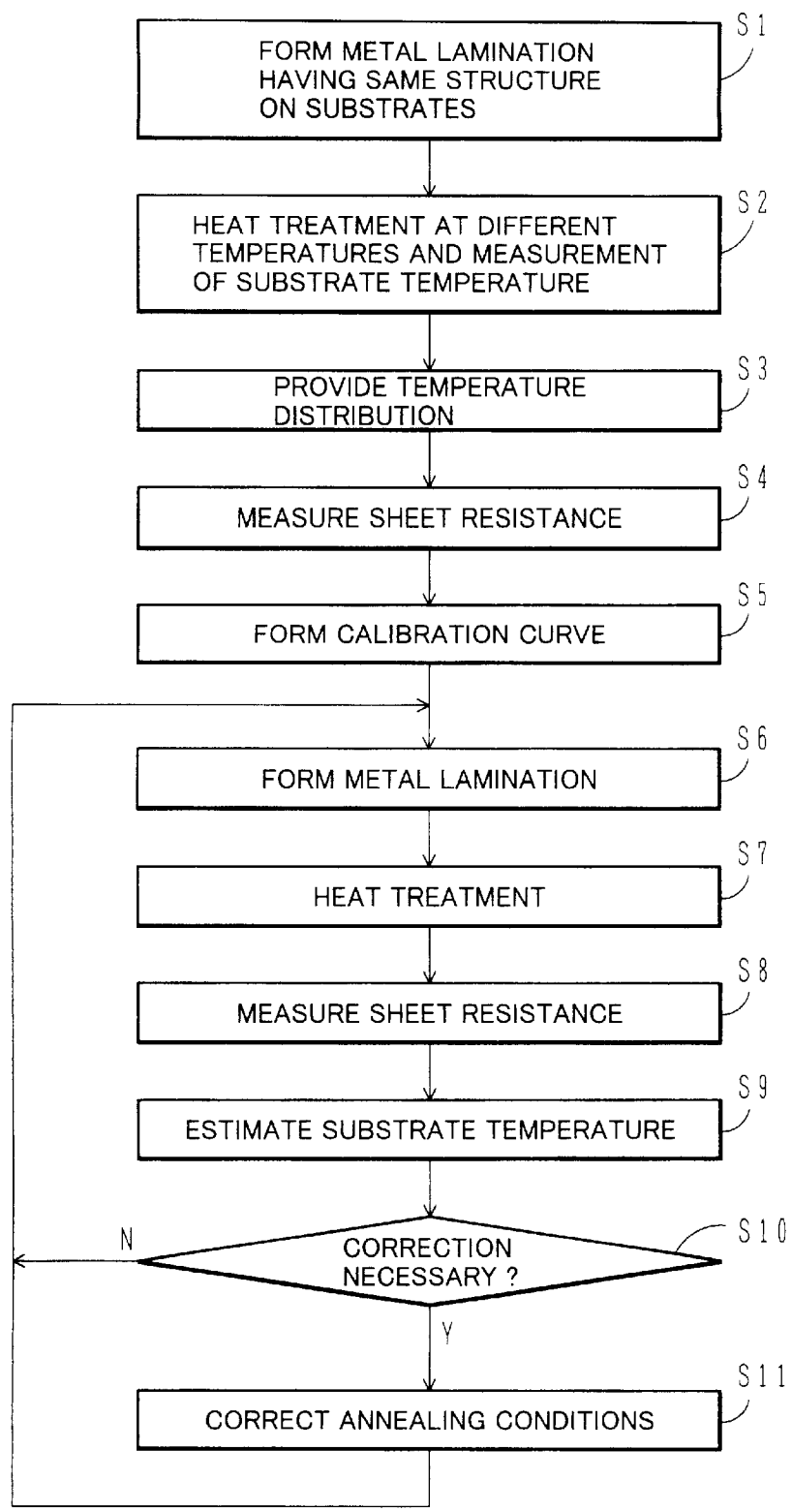
FIG. 1 is a flow chart illustrating the processes of a substrate temperature measuring method according to an embodiment of the invention.

FIG. 1 is a flow chart illustrating the main processes of a substrate temperature measuring method to be used at the heat treatment of a wiring layer, according to the embodiment of the invention.

First, at Step S1 a metal lamination layer having the same structure is deposited on each of a plurality of substrates. The metal lamination layer is, for example, an Al/Ti lamination layer.

Figure 2A:
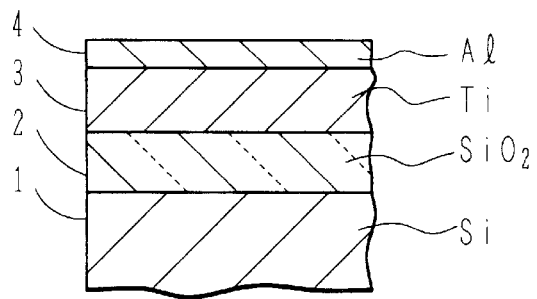
FIGS. 2A–2C are schematic cross sectional views of a substrate illustrating the processes of the substrate temperature measuring method shown in FIG. 1.

FIG. 2A shows an example of a metal lamination layer formed on a substrate. On a Si substrate, an $SiO_2$ insulating film 2 is formed. On this $SiO_2$ insulating film 2, a Ti layer 3 of about 40 nm thick and an Al layer 4 of about 20 nm thick are stacked by sputtering. Substrates having the same structure, for example, six substrates, are prepared.

Returning back to FIG. 1, at Step S2 each substrate with the metal lamination layer is subjected to heat treatment at a different temperature, and the substrate temperatures are measured during the heat treatment.

Figure 2B:
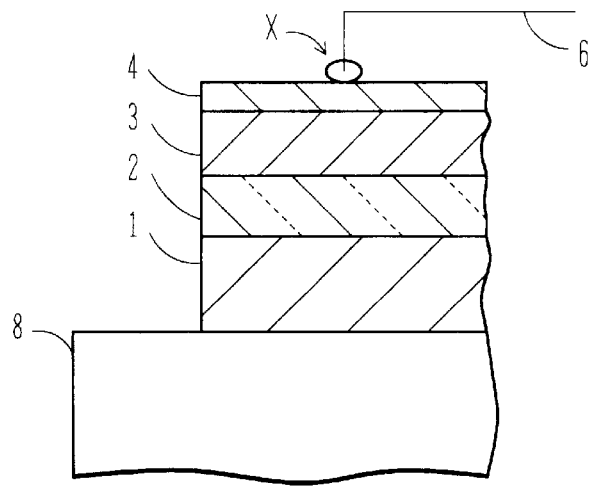

For example, as shown in FIG. 2B, thermocouples 6 are adhered with adhesive or the like to the surface of the substrate with the metal lamination layer 3, 4. The number of thermocouples is determined in accordance with the number of desired measurement points. The semiconductor substrate 1 mounted with the thermocouples is placed on a heater 8 and subjected to heat treatment.

The annealing temperatures are set at an interval of 20° C. in the range from 400° C. to 500° C. which is the range used with a general aluminum reflow process. The set substrate heating temperatures are therefore 400, 420, 440, 460, 480 and 500° C. The six substrates are subjected to heat treatments at these different temperatures, and the substrate temperatures during the heat treatments are measured. Even if a heating temperature is set to a predetermined value, the actual temperatures at the surface of the substrate are not necessarily constant but they have usually some distribution.

Returning back to FIG. 1, the temperature distributions measured by thermocouples are provided for each annealing temperature at Step S3.

At Step S4 a sheet resistance of the wiring layer on the substrate after the heat treatment is measured. The positions where the sheet resistance is measured is set particularly at or near the points where the substrate temperature was measured with the thermocouple.

Figure 2C:
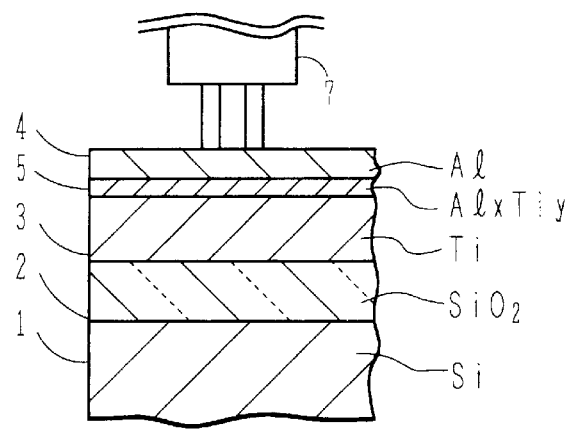

As shown in FIG. 2C, sheet resistance is measured, for example, with a resistance meter 7 having four probes. The measured sheet resistance changes with the formation state of an $Al_xTi_y$ layer 5 at the interface between the Ti layer 3 and Al layer 4.

At Step S5 a correlation between the substrate temperature measured with the thermocouple at one position and the sheet resistance measured at or near the same point after the heat treatment is plotted on a correlation graph, to form a calibration curve. Plots are connected by an estimated calibration curve. Instead of the calibration curve, a table or the like may be formed.

Figure 3:
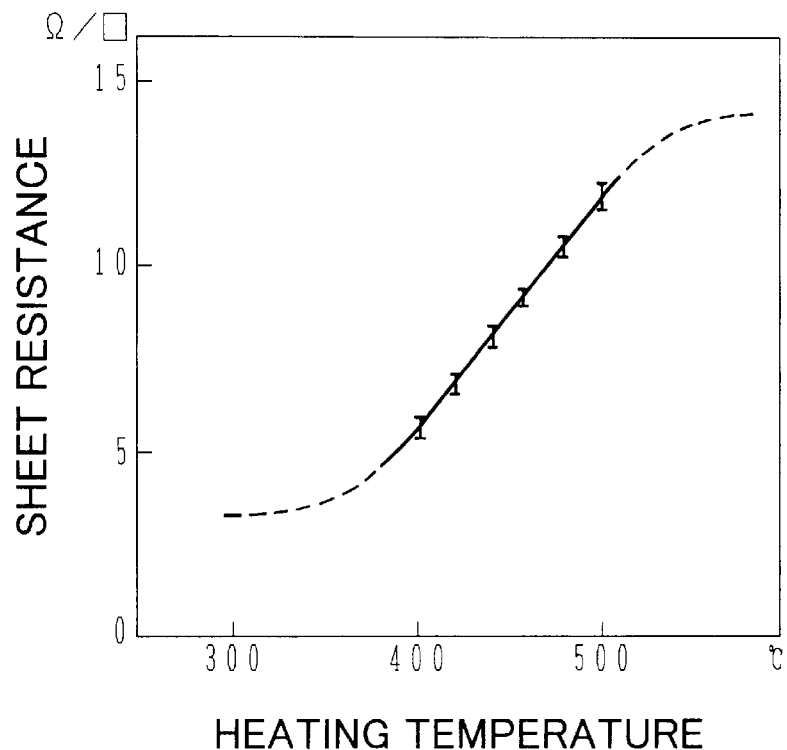
FIG. 3 is a graph showing a relationship between a sheet resistance and a heating temperature, obtained through preliminary experiments.

FIG. 3 is a graph of a calibration curve representative of the correlation between the annealing temperatures and the sheet resistances of the wiring layers after the heat treatments.

Once such a correlation is obtained, the substrate temperature during heat treatment can be known from the sheet resistance, measured after the heat treatment, of the metal lamination layer having the same structure.

Reverting to FIG. 1, at Step S6 a metal lamination layer is formed on a semiconductor substrate, as an actual manufacture process. The structure of the metal lamination layer is the same as the metal lamination layer formed at Step S1. It is preferable that a metal lamination layer having the structure quite the same as a metal lamination structure used in the actual manufacture process is formed at the preparatory step S1, and that the substrate temperatures are measured directly with thermocouples or the like to form the calibration curve at Step S5.

At Step S7 each substrate is subjected to heat treatment at a desired temperature designed for actual manufacture processes.

At Step S8 the sheet resistance of a wiring layer of the substrate after the heat treatment is measured. Measuring sheet resistance can be performed easily with four probes shown in FIG. 2C or the like, without any limitation in the number of measurement points. Therefore, the desired number of measurement points can be set over the whole area of the substrate surface.

At Step S9 the substrate temperature after the heat treatment is estimated from the correlation curve such as shown in FIG. 3, by using the measured sheet resistance. It is to be noted that the formation state of an alloy layer can also be estimated, such as illustrated in FIGS. 6A–6C.

Figure 4:
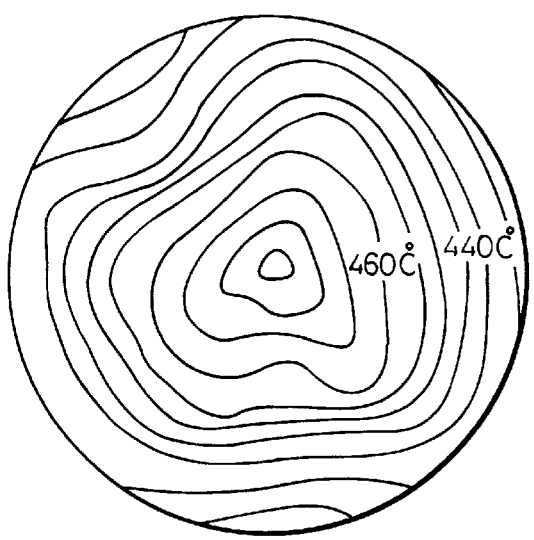
FIG. 4 is a plan view of a substrate showing a temperature distribution on the substrate surface obtained by the substrate temperature measuring method shown in FIG. 1.

FIG. 4 shows an example of substrate temperatures estimated from sheet resistances and represented by isothermal lines drawn on the whole area of the substrate surface.

At Step S10 it is checked, from the substrate temperatures (and from the formation state of an alloy layer) estimated from sheet resistances, whether the heat treatment was carried out in a designed allowable range. If it is necessary to correct the set temperature of the heat treatment, the flow follows an arrow Y to advance to Step S11 whereat the heating conditions of the heat treatment are corrected.

If it is judged at Step S10 that correction is unnecessary, the flow follows an arrow N to return to Step S6. If correction is entered at Step S11, the flow also returns to Step S6. Thereafter, similar cycles from Step S6 as above are repeated. With the above-described heat treatment, even if the actual substrate temperature during heat treatment changes because of a change in the process conditions, parameters of the manufacture process can be corrected before such a change leads to any defects of the manufactured products. It is therefore possible to maintain good manufacture yield.

Although management of an annealing temperature has been described mainly, the formation state of an alloy layer may be managed. After the formation state of an alloy layer is checked through measurement of sheet resistance, this formation state is compared with desired conditions designed for the actual manufacture process. If correction is necessary, the annealing conditions are changed by using the temperatures estimated from the calibration curve as parameters.

In the above description, the Al/Ti lamination layer is set to 20/40 nm by way of example. The structure of a sample for the preparatory process changes with that of a semiconductor device to be finally produced. In an actual wiring layer, an Al layer is considerably thicker than a Ti layer. Even in such a case, it is apparent from those skilled in the art that the substrate temperature measuring method of the above embodiment is applicable. The substrate temperature measuring method is also applicable not only to a heat treatment process by a sputtering system but also to a heat treatment process by lamp annealing, diffusion furnace, chemical vapor deposition (CVD), dry etcher and the like.

The structure of a wiring layer is not limited to an Al/Ti lamination layer. For example, Al, Al alloy, Cu or the like may be used as the main wiring layer, and Co, Ni or the like as well as Ti may be used as the underlying metal layer such as a close or tight contact layer and a barrier layer. Wiring structures of three or more layers can also be employed.

The present invention has been described in connection with the preferred embodiments. The invention is not limited only to the above embodiments. It is apparent that various modifications, improvements, combinations, and the like can be made by those skilled in the art.

I claim:

1. A method of measuring a substrate temperature comprising the steps of:
    preparing a correlation between heat treatment temperature and sheet resistance;
    forming a first lamination of different metals on a substrate;
    subjecting the substrate to a heat treatment to generate an alloy layer at an interface between the different metals;
    measuring a sheet resistance of the substrate after the heat treatment; and
    estimating, after the heat treatment, a temperature of the substrate during the heat treatment from the correlation.

2. A method according to claim 1, wherein said preparing step includes:
    forming a second lamination having a structure which is the same as the first lamination on each of a plurality of preparatory substrates;
    subjecting the preparatory substrates to heat treatments at a plurality of predetermined heat treatment temperatures to generate an alloy layer at an interface between the different metals;
    measuring temperatures of each preparatory substrate under the heat treatment;
    measuring sheet resistance of each second lamination on each of the preparatory substrate after the heat treatment; and
    obtaining correlation between the measured sheet resistances and the measured substrate temperatures.

3. A method according to claim 1, wherein the lamination of different metals comprises a Ti layer and, an Al layer or an Al alloy layer formed on the Ti layer.

4. A method according to claim 2, wherein the lamination of different metals comprises a Ti layer and, an Al layer or an Al alloy layer formed on the Ti layer.

5. A method according to claim 1, wherein the generation of the alloy layer increases resistance of the lamination.

6. A method of forming a wiring layer comprising the steps of:
    preparing a correlation between formation states of an alloy layer and sheet resistance;
    forming a first lamination of different metals on a substrate;
    subjecting the substrate to a heat treatment to generate an alloy layer at an interface between the different metals;
    measuring a sheet resistance of the substrate after the heat treatment; and
    estimating, after the heat treatment, formation of an alloy layer in the first lamination from the correlation.

7. A method according to claim 6, wherein said preparing step includes:
    forming second lamination having a structure which is the same as the first lamination on each of a plurality of preparatory substrates;
    subjecting the preparatory substrates to heat treatments at a plurality of predetermined heat treatment temperatures to generate an alloy layer at an interface between the different metals;
    measuring temperatures of each preparatory substrate under the heat treatment;
    measuring a sheet resistance and a formation state of an alloy layer in each second lamination on each of the preparatory substrate after the heat treatment; and
    obtaining correlation between the measured sheet resistances and the measured formation states of alloy layers.

8. A method according to claim 6, wherein the generation of the alloy layer increases resistance of the lamination.

9. A method according to claim 6, wherein the lamination of different metals comprises a Ti layer and, an Al layer or an Al alloy layer formed on the Ti layer.

10. A method according to claim 6, wherein the lamination of different metals comprises a Ti layer and, an Al layer or an Al alloy layer formed on the Ti layer.

11. A method according to claim 6, further comprising the step of changing a heat treatment temperature of another substrate in accordance with the estimated formation state of an alloy layer and the measured sheet resistance.

* * * * *